United States Patent [19]

Kirk

[11] Patent Number: 5,134,366
[45] Date of Patent: Jul. 28, 1992

[54] MAGNETIC HEAD TESTING APPARATUS FOR DETECTING OCCURRENCES OF POPCORN NOISE AMID EXTERNALLY GENERATED NOISE

[75] Inventor: James W. Kirk, Westboro, Mass.

[73] Assignee: Digital Equipment Corporation, Maynard, Mass.

[21] Appl. No.: 719,042

[22] Filed: Jun. 21, 1991

[51] Int. Cl.$^5$ .................... G11B 27/36; G01R 33/12
[52] U.S. Cl. ................................ 324/210; 324/212; 324/613; 369/55; 360/31
[58] Field of Search ...................... 360/31; 369/53, 55, 369/58; 324/210, 212, 613

[56] References Cited
U.S. PATENT DOCUMENTS

| 3,375,439 | 3/1968 | Yamamoto | 324/210 |
| 3,692,987 | 9/1972 | Bos | 324/613 |
| 4,504,871 | 3/1985 | Berwick | 324/210 |
| 4,862,078 | 8/1989 | Kawabata | 324/212 |

Primary Examiner—Kenneth A. Weider
Assistant Examiner—Jose M. Solis
Attorney, Agent, or Firm—Hamilton, Brook, Smith & Reynolds

[57] ABSTRACT

A magnetic head tester has a popcorn noise detector for discriminating internally generated popcorn noise events from externally generated noise events. The popcorn noise detector includes a discriminator which receives the magnetic head output signal from the head and generates a comparator pulse for each popcorn noise event detected. A counter counts the number of pulses output from the detector. The discriminator includes a retriggerable noise detection gate circuit for producing a noise detection gate signal when triggered by a comparator pulse. The discriminator responds to a single comparator pulse during the gate period by indicating a popcorn noise event at the output of the discriminator. The discriminator responds to a plurality of comparator pulses during the gate period by indicating that no popcorn noise event has occurred. Embodiments of the discriminator include a first latch configured to toggle from an initial state on each comparator pulse occurring during the gate period, a second latch configured to switch from an intial state to another state on the occurrence of at least one toggle of the first latch back to its initial state during the gate period, and a third latch for storing the state of the second latch at the end of the gate period. A reset circuit resets the initial state of the latches after the trailing edge of the gate signal.

24 Claims, 3 Drawing Sheets

MAGNETIC HEAD TESTING APPARATUS FOR DETECTING OCCURRENCES OF POPCORN NOISE AMID EXTERNALLY GENERATED NOISE

BACKGROUND OF THE INVENTION

Magnetic heads used in the production of magnetic media drives, e.g., magnetic tape and magnetic disk drives, are susceptible to error producing write relaxation induced Barkhausen ("popcorn") noise. Such popcorn noise is characterized by a single high frequency pulse generated internally by the magnetic head after the head has been written to. Although the occurrence of popcorn noise is difficult to predict, some magnetic heads exhibit a higher propensity for producing popcorn noise than others. Magnetic heads may be tested at the manufacturing stage to screen out those heads exhibiting an unacceptable popcorn noise characteristic.

The manufacturing and testing of magnet heads typically takes place in an industrial environment having a wide assortment of electrical equipment which produce electrical noise. A large part of this externally produced electrical noise is characterized by short bursts of high frequency pulses. These pulses are often detected by the magnetic head under test or by the testing equipment itself and interfere with the detection of true popcorn noise events, i.e., each burst of pulses may falsely counted as multiple popcorn noise events. Ultimately, the popcorn noise characterization of a magnetic head under test may depend more on the externally generated noise pulses than on the internally generated popcorn noise, leading to rejection of otherwise acceptable magnetic heads.

SUMMARY OF THE INVENTION

In general, the present invention provides a magnetic head tester having a popcorn noise detector for discriminating internally generated popcorn noise events from externally generated noise events. The tester includes a control timer for generating a test cycle having a write period during which write pulses are written to the head under test, a wait period, and period during which a magnetic head output sign monitored from the head. The popcorn noise detector receives the magnetic head output signal from the head and generates a pulse for each popcorn noise event detected. A counter counts the number of pulses output from the detector.

Preferred embodiments of the popcorn noise detector include a comparator for comparing the amplitude of the magnetic head output signal to an upper and lower programmable threshold and generating pulse when either threshold is exceeded. A discriminator detects popcorn noise events from the comparator pulses to generate a detector output pulse for each popcorn noise event detected. Embodiments include a preamplifier connected between the head and the comparator, an amplifier connected between the preamplifier and the comparator, and a low pass filter connected between the amplifier and the comparator. Yet other embodiments include a programmable write clock for generating the write pulses the write period and a programmable write current sink.

Preferred embodiments of the popcorn noise discriminator include a retriggerable noise detection gate circuit for producing a noise detection gate signal when triggered by a pulse from the comparator. The discriminator responds to a single comparator pulse during the period of the gate signal by indicating a popcorn noise event at the output of the discriminator. The discriminator responds to a plurality of comparator pulses during the gate signal period by indicating that no popcorn noise event has occurred. One implementation of the discriminator further includes a first latch configured to toggle from an initial state on each comparator pulse occurring during the gate period, a second latch configured to switch from an initial state to another state on the occurrence of at least one toggle of the first latch back to its initial state during the gate period, and a third latch for storing the state of the second latch at the end of the gate period. A reset circuit resets the initial state of the latches after the trailing edge of the gate signal.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis being placed upon illustrating the principles of the invention.

DETAILED DESCRIPTION OF THE PREFERRED EMBODIMENT

Figure 1:
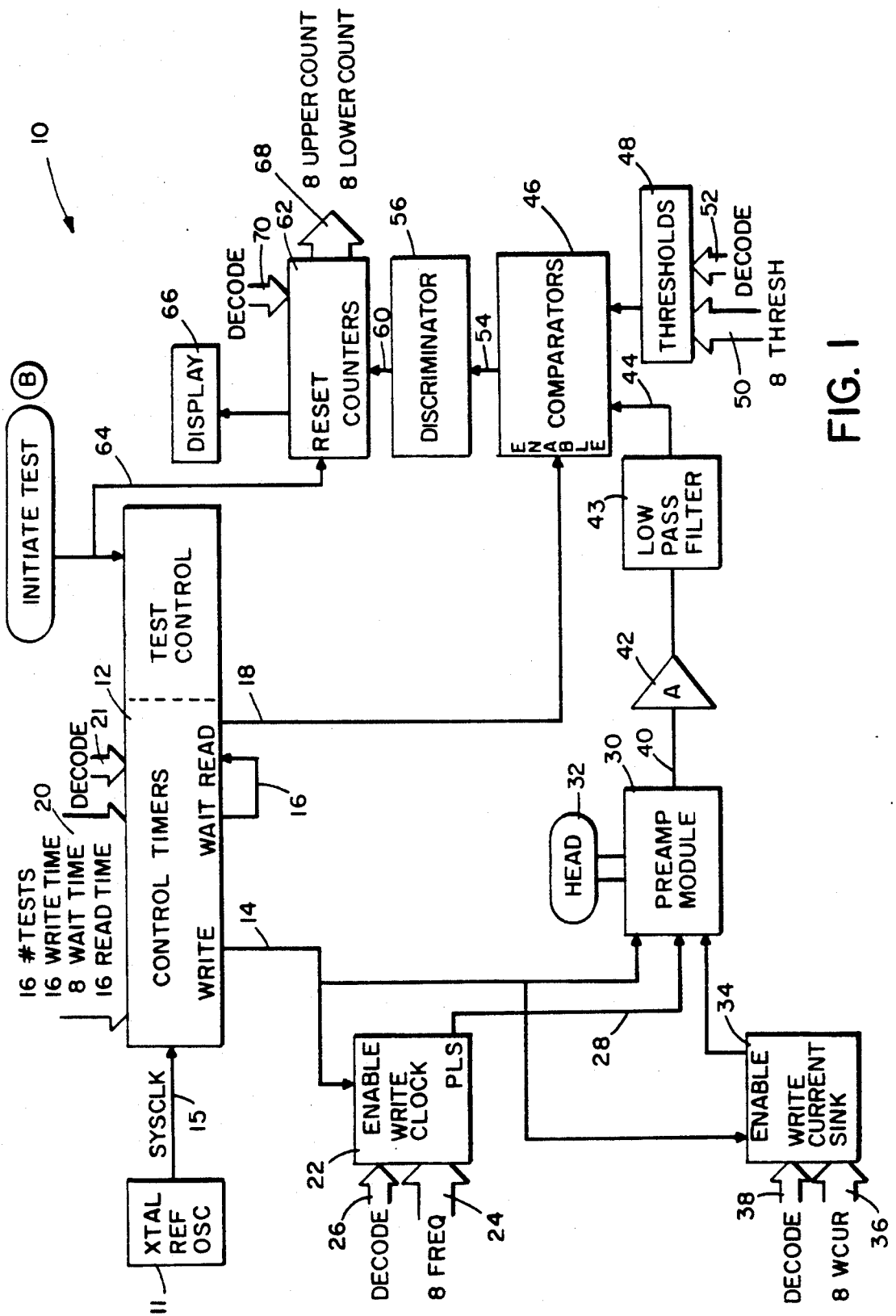
FIG. 1 is a block diagram of the magnetic head testing instrument of the present invention.

Referring to FIG. 1, there is shown a magnetic head testing instrument 10 having popcorn noise discrimination and detection according to this invention. A typical magnetic head test performed by the instrument 10 includes multiple test cycles. Each test cycle includes a "write" period during which the stream of high frequency pulses is written to the magnetic head under test for a predetermined time interval, a "wait" period during which no pulses are written to the magnetic head under test for a predetermined time interval, and then a "read" period during which the magnetic head output signal is monitored for a predetermined time interval. Typical test cycle times include about a 100–200 $\mu S$ write period, about a 10 $\mu S$ wait period, and about a 100–200 $\mu S$ read period. A popcorn noise event is counted for each popcorn noise pulse detected during the read period. A magnetic head under test will typically undergo 10,000 test cycles during which the number of popcorn noise events are accumulated. The accumulated number of popcorn events counted during the test period is an indication of the quality of the magnetic head under test.

Test instrument 10 includes control timer and test control circuitry 12 for generating test cycle control signals WRITE ENABLE on line 14, WAIT on line 16, and READ ENABLE on line 18. A microprocessor (not shown) sets the parameters of control timers of circuity 12 through a plurality of microprocessor write registers 20 decoded by microprocessor register decoder 21. Specifically, the microprocessor writes to a 16-bit TEST# register the number of test cycles to be performed, and writes to a 16-bit WRITE TIME register a parameter controlling the duration of the WRITE ENABLE pulse output on line 14. The microprocessor also writes to an 8-bit WAIT TIME register a WAIT parameter determining the period of time between the end of the WRITE ENABLE pulse on line 14 and the beginning of the READ ENABLE pulse on line 18, and writes to a 16-bit READ TIME register a parameter determining the duration of the READ ENABLE pulse on line 18. A crystal reference oscillator 11 provides a SYSCLK clock signal on line 15 to the control timers or circuitry 12 thereby establishes system timing. Typically, the crystal reference oscillator 11 operates at 10 MHz, providing a 100 nS system clock period.

The WRITE ENABLE signal on line 14 enables a write clock circuit 22 which generates a sequence of write pulses on line 28 during the write period of each test cycle. The frequency of the write pulses generated by the write clock circuit 22 is determined by an 8-bit FREQ frequency parameter written to a microprocessor write register 24 decoded by a microprocessor register decoder 26. The generated write pulses are output on line 28 and drive a magnetic head preamplifier module 30.

Magnetic head preamplifier 30, driven by the write pulses on line 28, simulates actual write pulses to a magnetic head 32 under test connected to the preamplifier module 30. The WRITE ENABLE signal line 14 enables the preamplifier module 30 to drive the test head 32 with write pulses during the write period. A write current sink circuit 34 is connected to the preamplifier module 30 and determines the write current parameters for driving the head 32 under test. The WRITE ENABLE signal on line 14 enables the write current sink circuit 34 to generate the write current parameters for preamplifier module 30. The magnetic head write current is determined by an 8-bit WCUR write current parameter written to a microprocessor write register 36 and decoded by a microprocessor register decoder 38.

The output signal from the magnetic head 32 under test is output from preamplifier module 30 on line 40 and amplified by an amplifier 42 having a gain A. The output from amplifier 42 passes through a low pass filter 43, which simulates the read channel of the system in which the magnetic head 32 under test will ultimately be installed. Preferably the low pass filter 43 has low frequency cutoff between about 5 and 50 MHz.

The magnetic head output signal amplified and translated is output from low pass filter 43 on line 44 and input to signal level comparators 46. Signal level comparators 46 compare the amplitude of the signal on line 44 with an upper and lower preset threshold level established by a threshold circuit 48. The magnitude of the upper and lower threshold levels are determined by an 8-bit THRESH threshold parameter written to a microprocessor write register 50, decoded by a microprocessor register decoder 52. The READ ENABLE signal on line 18 enables comparators 46 to operate only during the read period of the test cycle so that the comparators do not respond to magnetic head output signals caused by high level write pulses driving the test head 32 during the write period of the test cycle, or ringdown signals during the wait period.

Comparators 46 output comparison signals on line 54 which in turn are input to popcorn noise discriminator circuit 56. It is discriminater 56 which provides enhanced popcorn noise discrimination and detection of the present invention.

Discriminator 56 produces a single pulse on line 60 for each popcorn noise event detected by the discriminator, yet produces no signal change on line 60 for each non-popcorn noise event detected. The pulses on line 60 are input to a popcorn noise counter 62 which accumulates the number of popcorn noise events occurring during testing of the magnetic head 32. A microprocessor writable INITIATE TEST bit on line 64 allows the microprocessor to reset the counter 62 at the beginning of each magnetic head test. The popcorn noise event count by accumulated by counter 62 may be read by the microprocessor from 8-bit UPPER COUNT and LOWER COUNT microprocessor readable registers 68 decoded by a microprocessor register decoder 70. Further, the count may be displayed on a display device 66.

Figure 2:
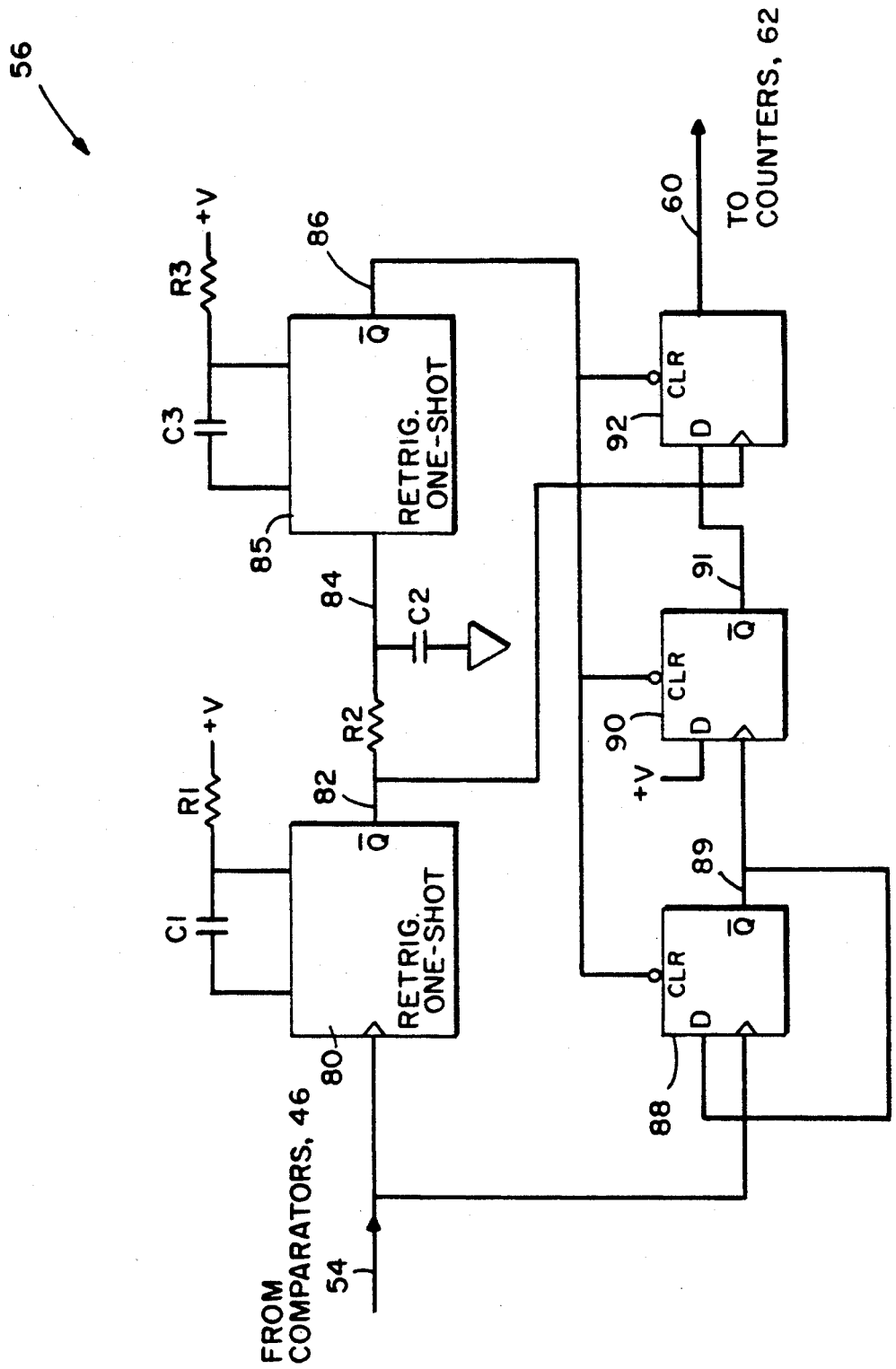
FIG. 2 is an electronic circuit schematic diagram of the popcorn noise discriminator of the testing instrument of FIG. 1.

Referring to FIG. 2, there is shown an exemplary circuit diagram of the popcorn noise discriminator 56 of FIG. 1. The initial state of the discriminator circuit is such that the Q outputs of all devices are low and the $\overline{Q}$ outputs are high. The output of comparators 46 (FIG. 1) on line 54 drive the rising edge triggered clock input of a retriggerable one-shot 80 whose $\overline{Q}$ on line 82 then provides a logic low noise detection gate having a duration period T. The period T of the noise detection gate on line 82 is determined by the ratio of resistor R1 and capacitor C1 connected to the timing inputs of retriggerable one-shot 80. Preferably the ratio R1/C1 is in the range of about 200 nS to about 5 $\mu$S. The noise detection gate on line 82 is delayed a period d by the combination of resistor R2 and capacitor C2, typically set between 20 nS and 500 nS, and is applied on line 84 to the rising edge triggered clock input of a second retriggerable one-shot 85. The $\overline{Q}$ output of retriggerable one-shot 85 on line 86 provides a reset pulse for resetting the initial conditions of the remaining circuit elements. The duration period P of the reset pulse on line 86 is determined by the combination of capacitor C3 and resistor R3 connected to the timing input terminals of the one-shot 85, and is typically set between 20 nS and 500 ns, and The output of comparators 46 (FIG. 1) on line 54 also drives the rising edge triggered clock input of a D flip-flop 88. The D input of flip-flop 88 is driven by its $\overline{Q}$ output on line 89, causing the $\overline{Q}$ to toggle each time the flip-flop is clocked. The CLR terminal of the flip-flop is connected to the reset line 86 so that the $\overline{Q}$ output is initialized to a logic high condition when the reset pulse occurs.

The $\overline{Q}$ output on line 89 drives the rising edge triggered clock input of a second flip-flop 90. The D input of flip-flop 90 is connected to a constant logic high level so that its $\overline{Q}$ output on line 91 is driven low by the first occurrence of the rising edge of a pulse on line 89 output from flip-flop 88. The CLR terminal of flip-flop 90 is connected to reset line 86 so that the $\overline{Q}$ output is initialized to a logic high condition when the reset pulse occurs.

The $\overline{Q}$ output of flip-flop 90 on line 91 drives the D input of a third flip-flop 92. The rising edge triggered clock input of flip-flop 92 is driven by the noise detection gate on line 82, and the Q output of flip-flop 92 on line 60 is connected to the input of popcorn noise event counters 62 of FIG. 1. The CLR terminal of flip-flop 92 is also connected to reset line 86 so that the Q output on line 60 is initialized to a logic low condition on the occurrence of a reset pulse.

Figure 3:
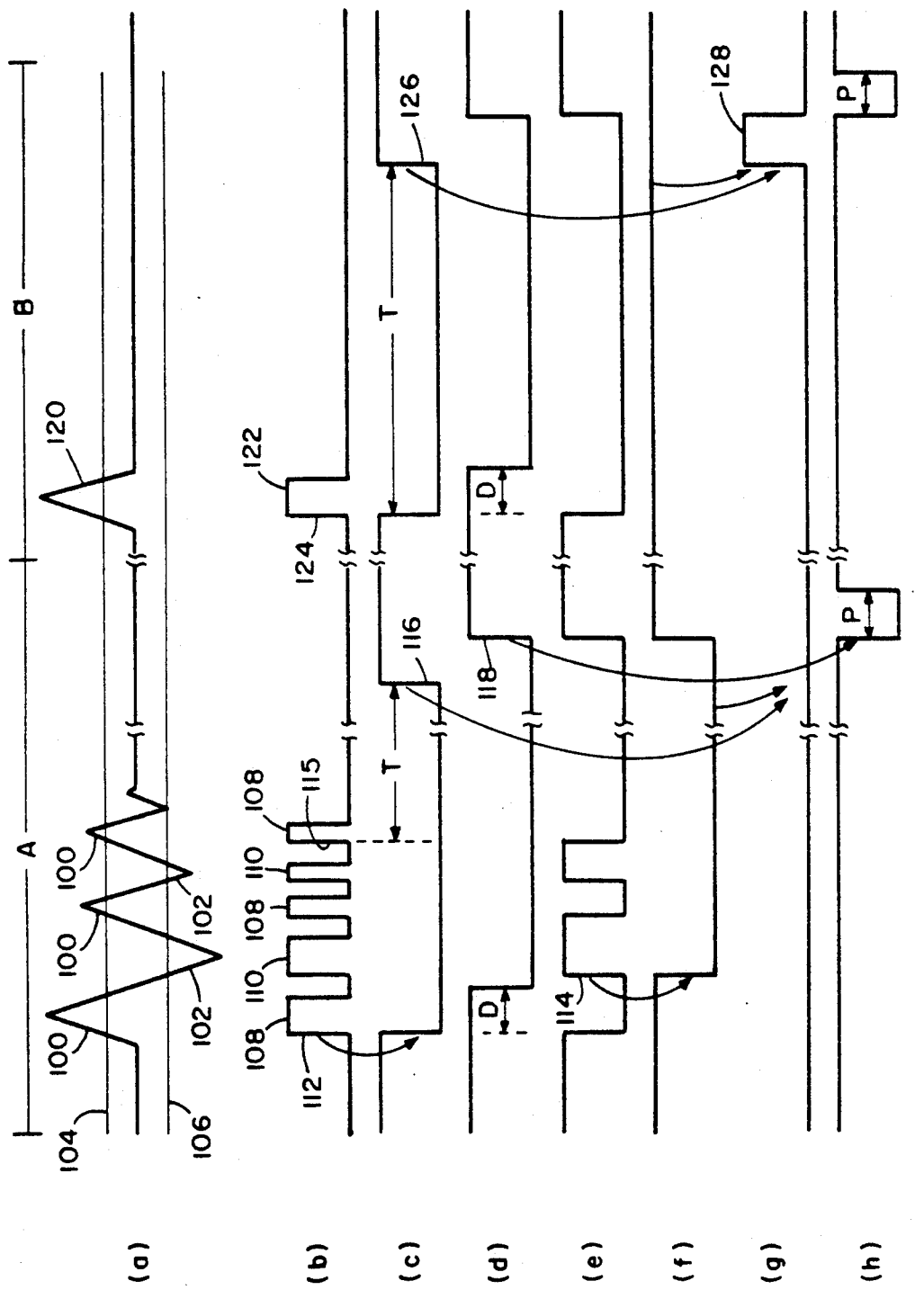
FIG. 3 is a timing diagram showing timing traces for the circuit elements of the discriminator of FIG. 2.

Referring to FIG. 3, there is shown a timing diagram illustrating the operation of popcorn noise discriminator 56 circuit of FIG. 2. The A (or left hand) portion of the timing diagram illustrates the discriminator 56 response to non-popcorn noise events, and the B (right hand) portion of the timing diagram illustrates the discriminator response to popcorn noise events.

With regard to the A portion of the timing diagram, trace(a) represents a typical non-popcorn noise event on the magnetic head output signal output from low pass filter 43 on line 44 of FIG. 1. The representative non-popcorn noise event is characterized by multiple positive and negative going spikes 100 and 102, respectively, exceeding a preset upper threshold 104 and preset lower threshold 106 as determined by threshold circuit 48 of FIG. 1 described previously. Trace(b) is the comparator 46 output on line 54 of FIG. 1 in response to the noise spikes of trace(a), producing output pulses 108 corresponding to the portion of positive going spikes 100 exceeding threshold 104 of trace(a), and pulses 110 corresponding to the negative going spikes 102 exceeding lower threshold 106 of trace(a). Thus, a plurality of comparator output pulses are produced on line 54 for each noise event having a plurality of noise pulses with an amplitude exceeding the upper or lower thresholds 104 and 106.

The rising edge 112 of the first comparator output pulse of trace(b) triggers retriggerable one-shot 80 (FIG. 2) to produce the negative going noise detection gate on line 82 shown in trace(c). Each successive comparator output pulse retriggers the noise detection gate. The duration period T of the noise detection gate of trace(c) following the rising edge 115 of the last comparator output pulse the A portion of trace(b) is determined by R1 and C1 as explained previously, and is usually between about 200 nS and 5 $\mu$S. In the preferred embodiment, T is typically set to 1 $\mu$S. Trace(d) shows the delayed noise detection gate on line 84 of FIG. 2 corresponding to the noise detection gate of trace(c) delayed by a period d. As explained previously, d is determined by the combination of R2 and C2.

Trace(e) shows the $\overline{Q}$ output of flip-flop 88 on line 89 (FIG. 2) having an initial logic high state with subsequent toggling caused by each of the rising edges of the pulses 108 and 110 of trace (b). The first rising edge 114 of trace(e) causes the $\overline{Q}$ output of second flip-flop 90 on line 91 (FIG. 2), shown in trace(f), to change to a logic low state. Subsequent rising edges of trace(e) have no effect on the state of trace(f) once the initial rising edge 114 has occurred. Thus, trace(f) remains at logic low until the reset pulse on line 86 (FIG. 2), shown in trace(h), clears flip-flop 90.

The logic low state of trace(f) is clocked into the D input of third flip-flop 92 by the rising edge 116 of the noise detection gate shown in trace(c). The output of flip-flop 92 on line 60 (FIG. 2), in trace(g), is unchanged and remains at its initial logic low state, thereby preventing counters 62 (of FIG. 1) from counting the non-popcorn noise event of trace(a) as a popcorn noise event.

The rising edge 118 of delayed noise detection gate of trace(d) triggers one-shot 85 (FIG. 2) to produce a reset pulse on line 86, shown in trace(h), which in turn clears flip-flops 88, 90 and 92 to the initial conditions shown in traces(e), (f), and (g), respectively. As defined previously, duration period P of the reset pulse is determined by R3/C3 of FIG. 2 and is between about 20 ns and 500 ns. Thus, no count pulse on 60 (FIG. 2) is sent to counters 62 as long as more than a single comparator pulse occurs during the noise detection gate duration period T.

Now with regard to the B portion of the timing diagram of FIG. 3, trace(a) shows a representative popcorn noise event characterized by a single positive going spike 120 exceeding upper threshold 104. This event could also be shown as a single negative going pulse exceeding lower threshold 106 which would produce the same detection results.

Trace(b) shows a single pulse 122 output from comparators 46 on line 54 (FIG. 1) corresponding to the portion of noise spike 120 exceeding threshold 104. The rising edge 124 of comparator pulse 122 triggers the noise detection gate of trace(c). First flip-flop 88 (FIG. 2) responds to the positive going edge 124 of trace(b) by changing state as shown on trace (e). However, since no other pulses occur on trace(b) during noise detection gate period T the $\overline{Q}$ output of flip-flop shown on trace(e) remains at logic low for the entire noise detection gate period. As such, no rising edges occur to trigger second flip-flop 90 whose $\overline{Q}$ output on line (FIG. 2) remains in its initial logic high state as shown by trace(f).

The rising edge 126 at the end of the noise detection gate of trace(c) clocks the logic high state of trace(f) into third flip-flop 92 (FIG. 2) whose Q output goes to a logic high as shown in trace(g). Flip-flop 92 Q output remains at logic high until the reset pulse of trace(h) clears flip-flop 92, thereby producing a counter pulse 128 on line 60 (FIG. 2). Produced counter pulse 128 causes counters 62 (of FIG. 1) to properly count the noise event of trace(a) as one popcorn noise event.

While this invention has been particularly shown and described with reference to a preferred embodiment thereof, it will be understood by those skilled in the art that various changes in form and details may be made therein without departing from the spirit and scope of the invention as defined by the appended claims. For example, a delay line may be substituted for one-shot 85 and configured to generate the desired reset pulse.

I claim:

1. An apparatus for testing magnetic heads comprising:

a control timer for generating a test cycle comprising a write period during which a plurality of write pulses are written to a magnetic head under test, a wait period, and a read period during which a magnetic head output signal from the magnetic head under test is monitored;

a noise detector for coupling to the magnetic head under test for monitoring the magnetic head output signal during the read period, and discriminating popcorn noise events from other noise events on the magnetic head output signal, the noise detector generating a first state on a detector output signal for each popcorn noise event detected and a second state on the detector output signal for each non-popcorn noise event detected; and a counter coupled to the noise detector for counting each occurrence of the first state on the detector output signal.

2. The apparatus of claim 1, said noise detector comprises:

a comparator for coupling to the magnetic head under test to receive magnetic head output signals and for comparing amplitude of the magnetic head output signal to a predetermined upper and lower threshold, the comparator generating a pulse on a comparator output signal when amplitude of the magnetic head output signal exceeds one of upper and lower threshold; and a discriminator coupled to the comparator for detecting and discriminating popcorn noise events from other noise events on the comparator output signal, the discriminator generating the first state on the detector output signal for each popcorn noise event detected.

3. The apparatus of claim 2, further comprising a preamplifier for coupling between the magnetic head under test and the comparator.

4. The apparatus of claim 3, further comprising an amplifier coupled between the preamplifier and the comparator.

5. The apparatus of claim 4, further comprising a low pass filter coupled between the amplifier and the comparator.

6. The apparatus of claim 5, wherein said low pass filter has a low frequency cutoff between 5 and 50 MHz.

7. The apparatus of claim 2 wherein said comparator further comprises a threshold circuit for determining the upper and lower thresholds in response to data generated by a microprocessor.

8. The apparatus of claim 2, wherein said discriminator comprises a noise detection gate circuit coupled to said comparator for producing a noise detection gate signal having a gate period and being triggered by the occurrence of a pulse on the comparator output signal;

in response to a single pulse occurring on the comparator output signal during the gate period, the discriminator generating the first state on the detector output signal, and in response to a plurality of pulses occurring on the comparator output signal during the gate period, the discriminator generating the second state on the detector output signal.

9. The apparatus of claim 8, wherein said discriminator further comprises:

a first latch circuit coupled to said comparator and having a first latch output signal preset to an initial state, the first latch circuit being configured to toggle the first latch output signal on each occurrence of a pulse on the comparator output signal during the gate period;

a second latch circuit coupled to the first latch circuit and configured to switch a second latch output signal from an initial state to another state on an occurrence of at least one toggle of the first latch output signal to the first latch output signal initial state; and a third latch circuit coupled to the second latch circuit and the retriggerable noise detection gate circuit, the third latch circuit being responsive to a trailing edge of the noise detection gate signal for storing the state of the second latch output signal upon the occurrence of the trailing edge of the noise detection gate signal, a third latch output signal switching from an initial state to a state indicative of the state of the second latch output signal upon the occurrence of the trailing edge of the noise detection gate signal; and a reset circuit for resetting the initial state of the first, second, and third latch output signals after the occurrence of the trailing edge of the noise detection gate.

10. The apparatus of claim 9 wherein the noise detection gate circuit comprises a first retriggerable one-shot having a period between about 200 nS and 5 μS defining the gate period.

11. The apparatus of claim 10 wherein the period is between 500 nS and 1.5 μS.

12. The apparatus of claim 10 wherein the reset circuit comprises a second retriggerable one-shot having a period between about 20 nS and 500 nS; and the discriminator further comprises a time delay circuit coupled in series between the retriggerable noise detection gate circuit and the reset circuit, the time delay circuit for delaying receipt of the noise detection gate signal by the reset circuit by a period between about 20 nS and 500 nS.

13. The apparatus of claim 12 wherein said time delay circuit is a RC network.

14. The apparatus of claim 1 further comprising:

a write clock for coupling to the magnetic head under test and coupled to the control timer for generating the write pulses during the write period; and a write current sink for determining a quantity of electrical current passing through the magnetic head under test during each write pulse, said write current sink being responsive to data generated by a microprocessor to set the quantity of electrical current.

15. The apparatus of claim 1, wherein said control timer is responsive to data generated by a microprocessor to set the write period, the wait period, and the read period in response to said generated data.

16. A popcorn noise detector having an output signal indicating a popcorn noise event, comprising:

a comparator for coupling to a magnetic head under test and for comparing an amplitude of a magnetic head output signal to a predetermined upper and lower threshold, the comparator generating a pulse on a comparator output signal when the amplitude of the magnetic head output signal exceeds one of the upper and lower threshold; and a discriminator coupled to the comparator for detecting popcorn noise events from other noise events on the comparator output signal, and generating a first state on the detector output signal for each popcorn noise event detected, and a second state on the detector output signal for each non-popcorn noise event detected.

17. The apparatus of claim 116, wherein said discriminator comprises a retriggerable noise detection gate circuit coupled to said comparator for producing a noise detection gate signal having a gate period and being triggered by the occurrence of a pulse on the comparator output signal;

wherein said discriminator responds to a single pulse occurring on the comparator output signal during the gate period by generating the first state on the detector output signal, and responds to a plurality of pulses occurring on the comparator output signal during the gate period by generating the second state on the detector output signal.

18. The apparatus of claim 16, wherein said discriminator further comprises a first latch circuit coupled to said comparator and having a first latch output signal preset to an initial state, the first latch circuit being configured to toggle the first latch output signal on each occurrence of a pulse on the comparator output signal during the gate period;

a second latch circuit coupled to the first latch circuit and configured to switch a second latch output signal from an initial state to another state on an occurrence of at least one toggle of the first latch output signal to the first latch output signal initial state; and a third latch circuit coupled to the second latch circuit and the retriggerable noise detection gate circuit, the third latch circuit being responsive to a trailing edge of the noise detection gate signal for storing the state of the second latch output signal upon the occurrence of the trailing edge of the noise detection gate signal, a third latch output signal switching from an initial state to a state indicative of state of the second latch output signal upon the occurrence of the trailing edge of the noise detection gate signal; and a reset circuit for resetting the initial state of the first, second, and third latch output signals after the occurrence of the trailing edge of the noise detection gate.

19. The apparatus of claim 118 wherein the noise detection gate circuit comprises a retriggerable one-shot having a period of between 200 nS and 5 µS.

20. The apparatus of claim 119 wherein the period T is between 500 nS and 1.5 µS.

21. The apparatus of claim 18 wherein
reset circuit comprises a second retriggerable one-shot having a period between about 20 nS and 500 nS; and the discriminator further comprises
a time delay circuit coupled in series between the noise detection gate circuit and the reset circuit, the time delay circuit for delaying receipt of the noise detection gate signal by the reset circuit by a period between about 20 nS and 500 nS.

22. The apparatus of claim 21 wherein said time delay circuit is an RC network.

23. A method for detecting popcorn noise events during magnetic head testing, comprising the steps of:
comparing amplitude of a magnetic head output signal of a magnetic head under test to a predetermined upper and lower threshold, and from said comparing generating a pulse on a comparison output signal when the amplitude of the magnetic head output signal exceeds one of the upper and lower threshold; and discriminating popcorn noise events from other noise events on the comparison output signal, said discriminating including generating a first state on a popcorn noise detection output signal for each popcorn noise event detected, and a second state on the popcorn noise detection output signal for each non-popcorn noise event detected.

24. The method of claim 23, wherein the step of discriminating further comprises:
generating a noise detection gate signal having a gate period and being triggered by the occurrence of a pulse on the comparison output signal;

responding to a single pulse occurring on the comparison output signal during the gate period by generating the first state on the popcorn noise detection output signal; and responding to a plurality of pulses occurring on the comparison output signal during the gate period by generating the second state on the popcorn noise detection output signal.

* * * * *

UNITED STATES PATENT AND TRADEMARK OFFICE
CERTIFICATE OF CORRECTION

PATENT NO. : 5,134,366
DATED : July 28, 1992
INVENTOR(S) : James W. Kirk

It is certified that error appears in the above-identified patent and that said Letters Patent is hereby corrected as shown below:

Column 6, line 61 (Claim 2, line 1 of that claim) before "said" insert ---wherein---.

Column 7, line 1 (Claim 2, line 9 of that claim) before "upper" insert ---the---.

Column 8, line 16 (Claim 13, line 2 of that claim) before "RC" change "a" to read ---an---.

Column 8, line 47 (Claim 17, line 1 of that claim) before the "," change "116" to read ---16---.

Column 9, line 22 (Claim 19, line 1 of that claim) before "wherein" change "118" to read ---18---.

Column 9, line 25 (Claim 20, line 1 of that claim) before "wherein" change "119" to read ---19---.

Column 9, line 27 (Claim 21, line 1 of that claim) after "wherein" insert ---the---.

Signed and Sealed this

Twenty-fourth Day of August, 1993

Attest:

Attesting Officer

BRUCE LEHMAN

Commissioner of Patents and Trademarks